(12) United States Patent
Kraft et al.

(10) Patent No.: US 9,245,843 B2
(45) Date of Patent: Jan. 26, 2016

(54) SEMICONDUCTOR DEVICE WITH INTERNAL SUBSTRATE CONTACT AND METHOD OF PRODUCTION

(71) Applicant: ams AG, Unterpremstätten (AT)

(72) Inventors: Jochen Kraft, Oberaich (AT); Jordi Teva, Eindhoven (NL); Cathal Cassidy, Okinawa (JP); Günther Koppitsch, Lieboch (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/373,627

(22) PCT Filed: Jan. 16, 2013

(86) PCT No.: PCT/EP2013/050736
§ 371 (c)(1),
(2) Date: Jul. 21, 2014

(87) PCT Pub. No.: WO2013/110533
PCT Pub. Date: Aug. 1, 2013

(65) Prior Publication Data
US 2014/0367862 A1    Dec. 18, 2014

(30) Foreign Application Priority Data
Jan. 25, 2012    (EP) .................................... 12152485

(51) Int. Cl.
*H01L 23/528* (2006.01)
*H01L 21/308* (2006.01)
*H01L 23/522* (2006.01)
*H01L 21/768* (2006.01)
*H01L 21/74* (2006.01)

(52) U.S. Cl.
CPC .......... *H01L 23/5226* (2013.01); *H01L 21/743* (2013.01); *H01L 21/76877* (2013.01); *H01L 21/76898* (2013.01); *H01L 2224/02372* (2013.01)

(58) Field of Classification Search
CPC ......................... H01L 21/743; H01L 21/76898
USPC .......................................................... 257/774
See application file for complete search history.

(56) References Cited

U.S. PATENT DOCUMENTS

| | | | |
|---|---|---|---|
| 2010/0109114 A1* | 5/2010 | Izumi ............................ | 257/434 |
| 2010/0144114 A1* | 6/2010 | Enichlmair et al. .......... | 438/424 |
| 2011/0018109 A1* | 1/2011 | Blaschke et al. ............. | 257/659 |
| 2011/0027962 A1 | 2/2011 | Bernstein et al. | |

FOREIGN PATENT DOCUMENTS

| | | |
|---|---|---|
| DE | 102009012594 A1 | 12/2009 |
| WO | 2008/058829 A1 | 5/2008 |

* cited by examiner

*Primary Examiner* — Daniel Shook
(74) *Attorney, Agent, or Firm* — McDermott Will & Emery LLP

(57) ABSTRACT

The semiconductor device comprises a substrate (1) of semiconductor material, a contact hole (2) reaching from a surface (10) into the substrate, and a contact metallization (12) arranged in the contact hole, so that the contact metallization forms an internal substrate contact (4) on the semiconductor material at least in a bottom area (40) of the contact hole.

10 Claims, 11 Drawing Sheets

SEMICONDUCTOR DEVICE WITH INTERNAL SUBSTRATE CONTACT AND METHOD OF PRODUCTION

The invention relates to a semiconductor device with internal substrate contact, which is connected from a substrate surface, and particularly to a semiconductor device comprising an interconnect leading through the substrate like a through-silicon via, and to a method of producing a semiconductor device with an internal substrate contact.

Applications of semiconductor devices may require that the substrate be maintained at a defined electric potential. To this end the substrate is often provided with an electrical contact at an outer surface, particularly the rear surface.

In three dimensional integration semiconductor substrates that are provided with integrated circuits are stacked and bonded. The conductors that are arranged on different substrates are connected by interconnects leading through a substrate, especially through-silicon vias. The through-silicon vias are usually insulated from the semiconductor material of the substrate by a dielectric layer. Electric signals that are transmitted on a through-silicon via are inductively coupled through the dielectric layer to the semiconductor substrate. A small number of induced charge carriers suffice to generate a high voltage, which may be detrimental to many applications. It would be advantageous if the ground potential could be applied to the semiconductor material surrounding the through-silicon via in order to absorb the charge carriers and thus prevent cross-talk and electrostatic damage.

DE 10 2009 012 594 A1 describes a through-substrate interconnect having insulating and electrically conductive layers. A dielectric layer may be omitted and a metal liner arranged immediately at the wall of the via hole, particularly in applications wherein the interconnect is a ground connection.

US 2010/0144114 A1 and US 2011/0027962 A1 describe semiconductor devices having trenches of different depths, which are produced employing different vertical etch rates for differently dimensioned mask windows.

It is an object of this invention to disclose a new semiconductor device having a substrate contact and a related method of production.

This object is achieved with the semiconductor device according to claim 1 and with the method of producing a semiconductor device according to claim 8. Embodiments and alterations derive from the dependent claims.

The semiconductor device comprises a substrate of semiconductor material, a contact hole reaching from a surface of the substrate into the substrate, and a contact metallization arranged in the contact hole, so that the contact metallization makes an internal substrate contact on the semiconductor material at least in a bottom area of the contact hole.

In an embodiment of the semiconductor device, the contact hole is a contact trench of longitudinal extension reaching from the substrate surface into the substrate, with a contact metallization in the contact trench making a substrate contact on the semiconductor material and the substrate contact occupying at least a bottom area of the contact trench. A through-substrate via is arranged in the substrate, and the contact trench is arranged along a line passing by the through-substrate via.

In an embodiment of the semiconductor device the substrate contact is limited by a dielectric layer arranged between the contact metallization and the semiconductor material of the substrate.

A further embodiment comprises a plurality of similar further contact holes reaching from the substrate surface into the substrate, provided with contact metallizations that are arranged in the contact holes and make internal substrate contacts on the semiconductor material.

The contact holes may especially be arranged in at least one row of contact holes. If the semiconductor device comprises a through-silicon via or, more generally, an interconnect leading through the substrate, which will in the following be called a through-substrate via, the row of contact holes may preferably be arranged along a line passing by the through-substrate via. The row of contact holes can especially be arranged surrounding the through-substrate via or separating two through-substrate vias from one another.

In a further embodiment the contact hole is in the shape of a trench of longitudinal extension. If the semiconductor device comprises a through-substrate via, the contact trench may preferably be arranged along a line passing by the through-substrate via. The contact trench can especially be arranged surrounding the through-substrate via or separating two through-substrate vias from one another.

A further embodiment comprises a via hole reaching from the substrate surface through the substrate to an opposite surface, thus penetrating the substrate. A via metallization is arranged in the via hole, forming a through-substrate via. The contact hole and the via hole have different widths or diameters.

The method of producing a semiconductor device comprises the steps of providing a substrate of semiconductor material, etching a contact hole into the semiconductor material, and disposing a contact metallization in the contact hole in such a way that the contact metallization makes a substrate contact on the semiconductor material at least in a bottom area of the contact hole.

A variant of the method comprises the use of a mask having at least a small opening and a large opening. The contact hole is etched through the small opening, and a via hole penetrating the substrate is etched through the large opening. Depending on the etch process, the contact hole may instead be etched through the large opening, whereas a via hole penetrating the substrate is etched through the small opening. A via metallization is disposed in the via hole.

A further variant of the method comprises performing an implantation of a dopant through the contact hole into the semiconductor material of the substrate before applying the contact metallization.

A further variant of the method comprises the use of a substrate of highly doped semiconductor material provided with an epitaxial layer of undoped or moderately doped semiconductor material. The substrate contact is formed on the highly doped semiconductor material.

The following is a detailed description of exemplary embodiments of the semiconductor device and examples of the method of production in conjunction with the accompanying drawings.

Figure 1:
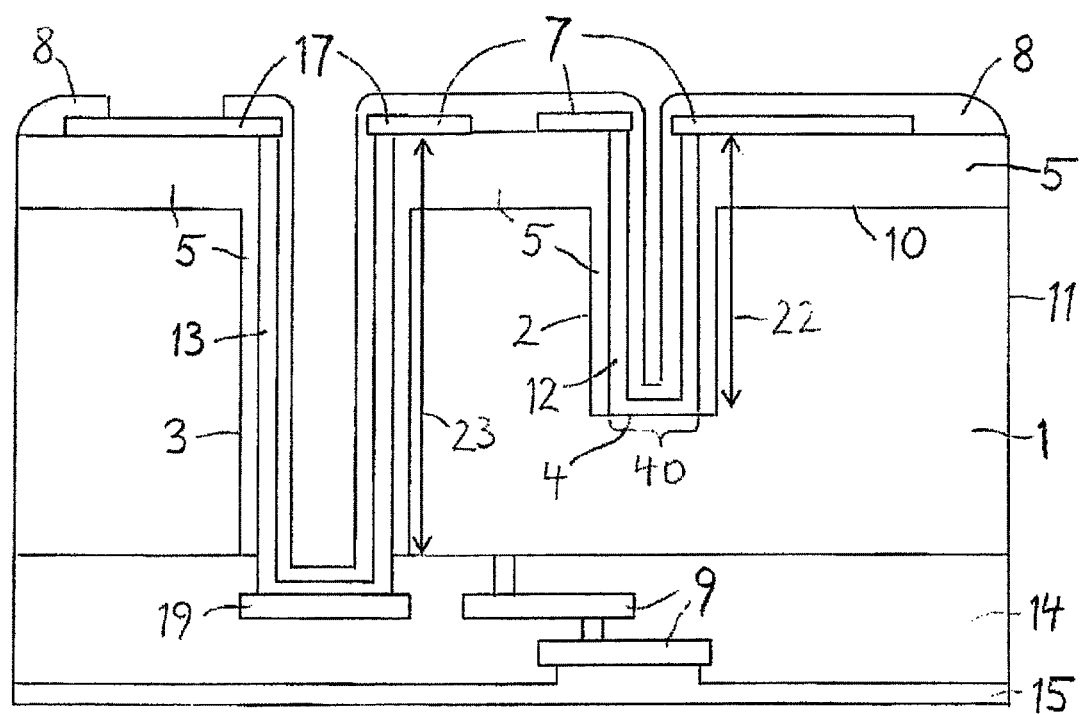
FIG. 1 shows a cross-section of an embodiment of the semiconductor device.

FIG. 1 shows a cross-section of an embodiment of the semiconductor device. A substrate 1 of semiconductor material, which may be silicon and which may comprise an integrated circuit, is provided with a contact hole 2 and a via hole 3.

The contact hole 2 reaches from a surface 10 of the substrate 1, which may be covered with a dielectric layer 5, vertically down into the substrate 1. The depth 22 of the contact hole 2 is less than the thickness of the substrate 1, including the thickness of the dielectric layer 5, so that a bottom area 40 of the contact hole 2 is formed by an internal surface of the semiconductor material within the substrate 1. A contact metallization 12 is located in the contact hole 2 and makes an internal substrate contact 4 on the semiconductor material of the substrate 1. The substrate contact 4 occupies at least the bottom area 40 of the contact hole 2. The semiconductor material adjacent to the substrate contact 4 is preferably doped and has a high doping concentration rendering a high electrical conductivity and a low-ohmic contact with the contact metallization 12.

The via hole 3 penetrates the substrate 1 from the surface 10 to the opposite surface. A via metallization 13 is located in the via hole 3 and makes a contact on a terminal 19 arranged in a dielectric layer 14 at or near the opposite surface, thereby forming a through-substrate via. A wiring 9 can be embedded in the dielectric layer 14, which may be provided with a planarizing layer 15 on the side facing away from the substrate 1. The dielectric layers 5, 14 and the planarizing layer 15 can be an oxide of the semiconductor material, especially silicon dioxide.

The depth 22 of the contact hole 2 may be typically about 110 μm and the depth 23 of the via hole 3 typically about 200 μm, for instance. A substrate edge 11 is indicated in FIG. 1 as a line of reference facilitating a comparison with the plan views according to FIGS. 2 to 4.

The contact metallization 12 and the via metallization 13 are in contact with a suitably structured surface metal 7, which may be formed as an integral part of the metallizations 12, 13 or may be applied as a separate metal layer in contact with the metallizations 12, 13. The surface metal 7 may provide pads, especially a pad 17 that is connected with the via metallization 13. The surface metal 7 and the metallizations 12, 13 are preferably covered and protected with a passivation 8, which may have one or several openings for external electrical connection, especially above the pad 17.

The contact metallization 12, the via metallization 13 or both the contact metallization 12 and the via metallization 13 can be insulated from the semiconductor material of the substrate 1 by a portion of the dielectric layer 5, which may be arranged on the walls of the contact hole 2 and the via hole 3. The bottom area 40 of the contact hole 2 is free from the dielectric layer 5 to accommodate the substrate contact 4.

Figure 2:
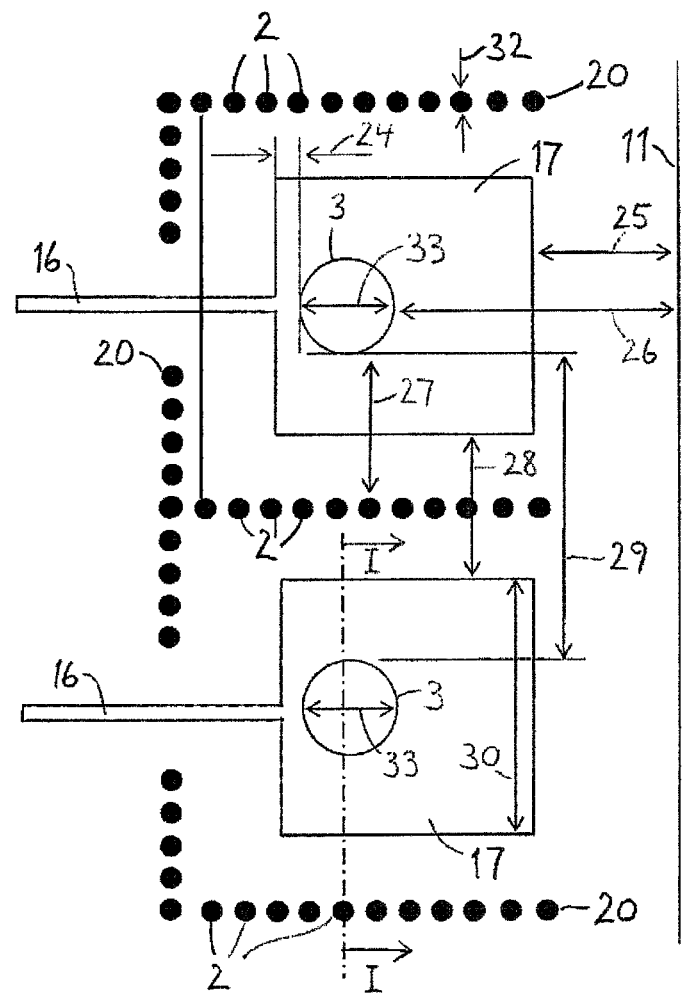
FIG. 2 shows a schematic plan view of an exemplary arrangement of cylindrical contact holes and via holes.

FIG. 2 shows a schematic plan view of an exemplary arrangement of contact holes 2 and via holes 3. The position of the cross-section shown in FIG. 1 is indicated in FIG. 2 by a broken line. The line on the right of FIG. 2 indicates the substrate edge 11. In the embodiment according to FIG. 2, the contact holes 2 are cylindrical and arranged in rows 20 along lines passing by the via holes 3, which are also cylindrical. The rows 20 of contact holes 2 are particularly arranged along lines surrounding the via holes 3 and separating the via holes 3 from one another. The via metallizations 13 are disposed on the walls of the via holes 3 and are connected with pads 17 arranged around the via holes 3.

The rows 20 of contact holes 2 may completely surround the via holes 3. In this case each of the pads 17 can be provided with an electrical connection inside the area that is surrounded by the rows 20 and encompasses the relevant pad 17. If instead conductor tracks 16 leading out of this area are provided for the pads 17, as shown in FIG. 2, the rows 20 of contact holes 2 are preferably interrupted so that the conductor tracks 16 can pass between two sections of the rows 20 and connect the pads 17 with electrical connections arranged outside the area that is surrounded by the rows 20.

The distance 24 between a via hole 3 and the closest edge of the appertaining pad 17 may be typically 10 μm. The distance 25 between a pad 17 and the substrate edge 11 may be typically 20 μm. The distance 26 between a via hole 3 and the substrate edge 11 may be typically 95 μm. The distance 27 between a via hole 3 and the closest row 20 of contact holes 2 may be typically 70 μm. The distance 28 between two neighboring pads 17 may be typically 60 μm. The distance 29 between a via hole 3 and the nearest further via hole 3 may be typically 150 μm. The distance 30 between opposite edges of a pad 17 may be typically 125 μm. The diameter 32 of the contact holes 2 may be typically 10 μm. The diameter 33 of the via holes 3 may be typically 40 μm.

Figure 3:
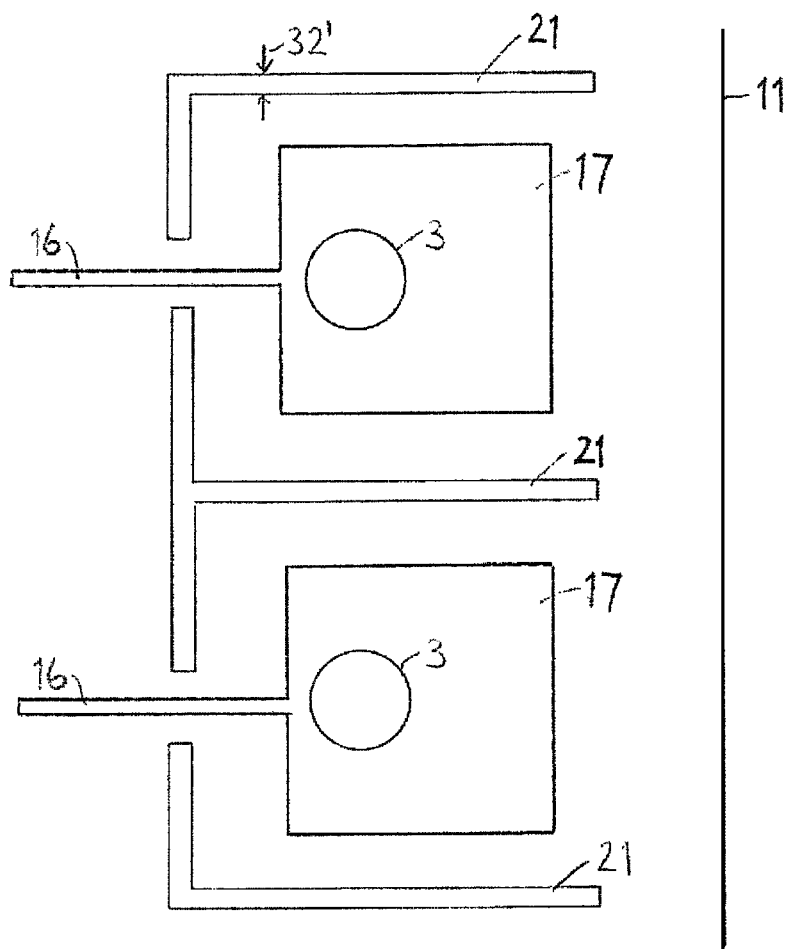
FIG. 3 shows a schematic plan view according to FIG. 2 of an exemplary arrangement of trenchlike contact holes and cylindrical via holes.

FIG. 3 shows a schematic plan view according to FIG. 2 of an exemplary arrangement of contact holes that are formed by contact trenches 21 instead of cylindrical contact holes. The contact trenches 21 may be arranged with their longitudinal extensions along lines passing by the via holes 3, according to the rows 20 of cylindrical contact holes 2 in the embodiment according to FIG. 2. The distances 24, 25, 26, 27, 28, 29, 30 and the diameter 33 of the via holes 3 indicated in FIG. 2 may be typically the same in the embodiment according to FIG. 3. If the depth of the contact trenches 21 substituting the rows 20 of cylindrical contact holes 2 is the same as the depth of the cylindrical contact holes 2, the width 32 of the contact trenches 21 is typically smaller than the width or diameter 32 of the cylindrical contact holes 2.

Figure 4:
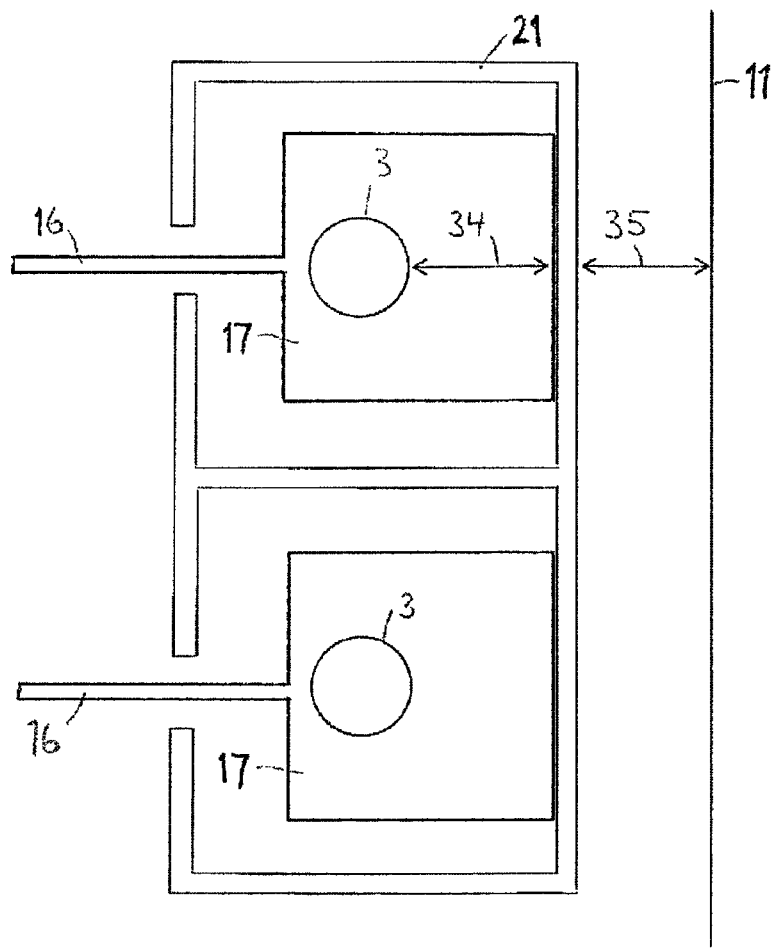
FIG. 4 shows a schematic plan view according to FIG. 3 for a further embodiment.

FIG. 4 shows a schematic plan view according to FIG. 3 for a further embodiment, in which the contact trenches 21 are additionally arranged between the via holes 3 and the substrate edge 11. The distances 34 and 35 from the via hole 3 and the substrate edge 11, respectively, to an intermediate section of the contact trench 21, may both be typically 42.5 μm. The distance between the pads 17 and the substrate edge 11 is accordingly larger than in the preceding embodiments; the other distances may typically be as given above.

Figure 5:
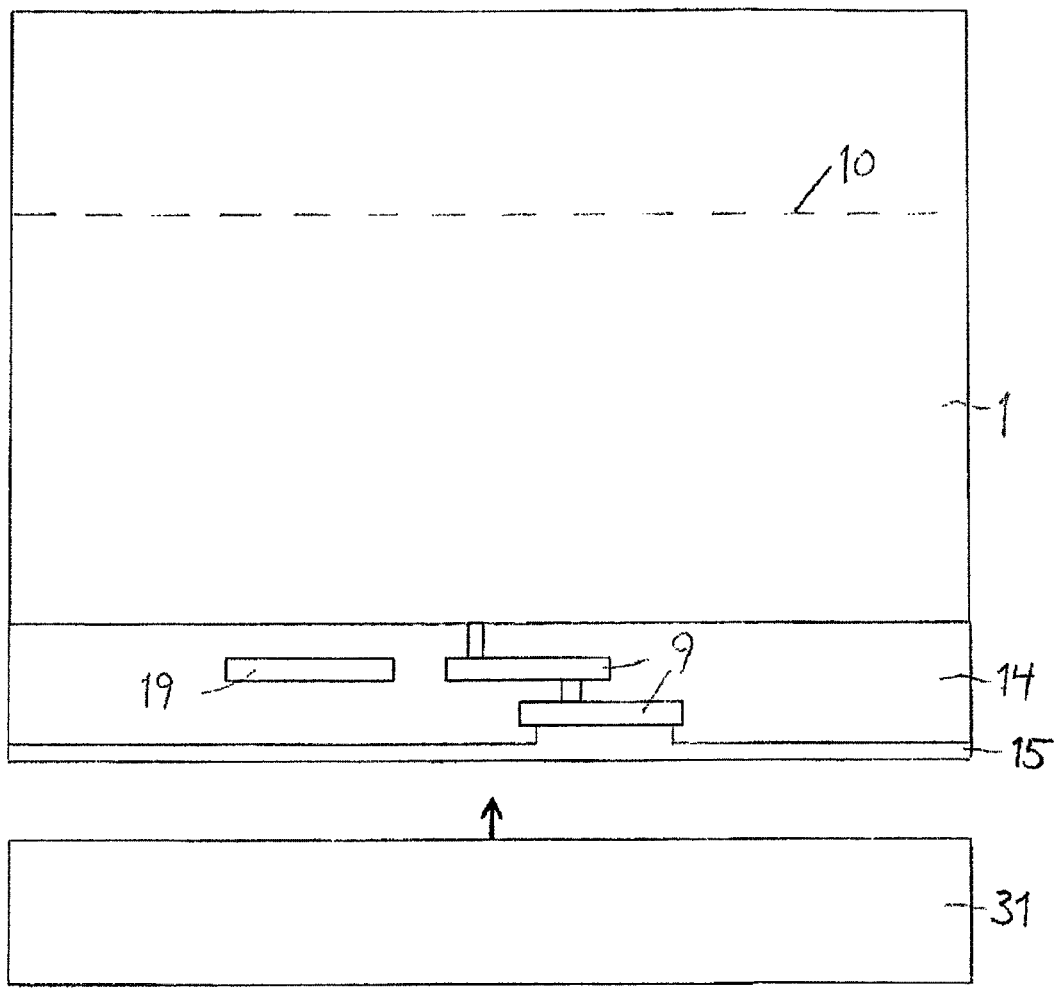
FIG. 5 shows a cross-section of an intermediate product of a method of producing the semiconductor device.

FIG. 5 shows a cross-section of an intermediate product of a method of producing the semiconductor device. A substrate 1 of semiconductor material, which may be provided with an integrated circuit and a wiring 9 embedded in a dielectric layer 14, is used as a start material. In the example shown in FIG. 5 an integrated circuit is supposed to be located at the substrate surface that is provided with the dielectric layer 14. Instead, the integrated circuit may be arranged at the upper substrate surface 10. A planarizing layer 15 may be provided to cover the dielectric layer 14 and any otherwise open contact areas on a metal layer of the wiring 9. The planarizing layer 15 may be an oxide of the semiconductor material, silicon dioxide for instance. The planarizing layer 15 serves as a bond layer to fasten a handling wafer 31 to the substrate 1. The planarizing layer 15 can be omitted if the dielectric layer 14 is used as a bond layer. The substrate 1 may then be thinned from the opposite side, until the surface 10 that is opposite to the integrated circuit reaches the position indicated in FIG. 5 by a broken line. The substrate 1 is not thinned in this method step if there is an integrated circuit at the upper surface 10. The substrate 1 may in this case have been thinned before from the side that is opposite to the integrated circuit, particularly before the dielectric layer 14 was applied.

Figure 6:
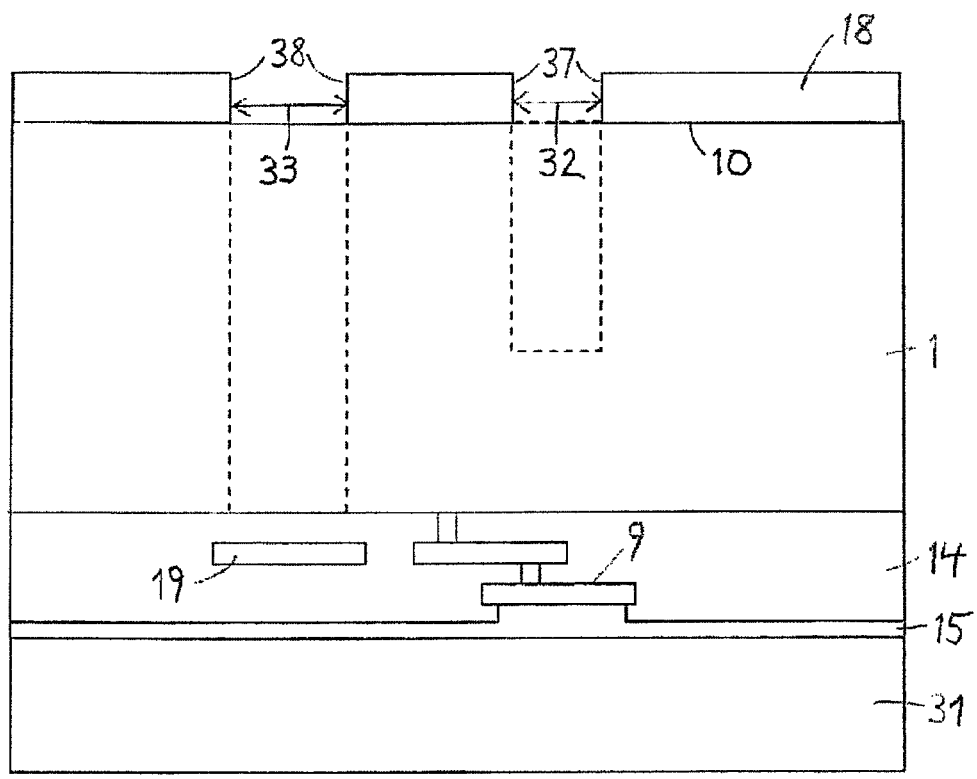
FIG. 6 shows a cross-section according to FIG. 5 after the application of an etch mask.

FIG. 6 shows a cross-section according to FIG. 5 after the application of an etch mask 18 to the surface 10. The mask 18 has at least one small opening 37 of the lateral dimension 32 of the contact hole 2 and may furthermore have at least one large opening 38 for the lateral dimension 33 of the via hole 3. The mask 18 is used to etch the semiconductor material anisotropically to form holes having the dimensions that are indicated in FIG. 6 by broken lines.

Different depths of the holes can easily be achieved with an etch process like deep reactive ion etching (DRIE), which enables different vertical etch rates depending on the lateral dimensions of the mask openings 37, 38. For example, circular mask openings having diameters of 10 µm, 15 µm, 20 µm and 25 µm may thus render cylindrical holes with typical depths of 110 µm, 135 µm, 160 µm and 180 µm, respectively. Normally, the opening 37 provided for the contact hole 2 should be smaller than the opening 38 provided for the via hole 3, but in variants of the method the DRIE etching recipe may be adapted to have an inverted aspect-ratio dependent etching (ARDE), which means that a larger mask opening produces a shallower hole than the smaller mask opening. In the following the method is explained for the typical examples in which the larger mask opening produces a deeper hole than the smaller mask opening.

Figure 7:
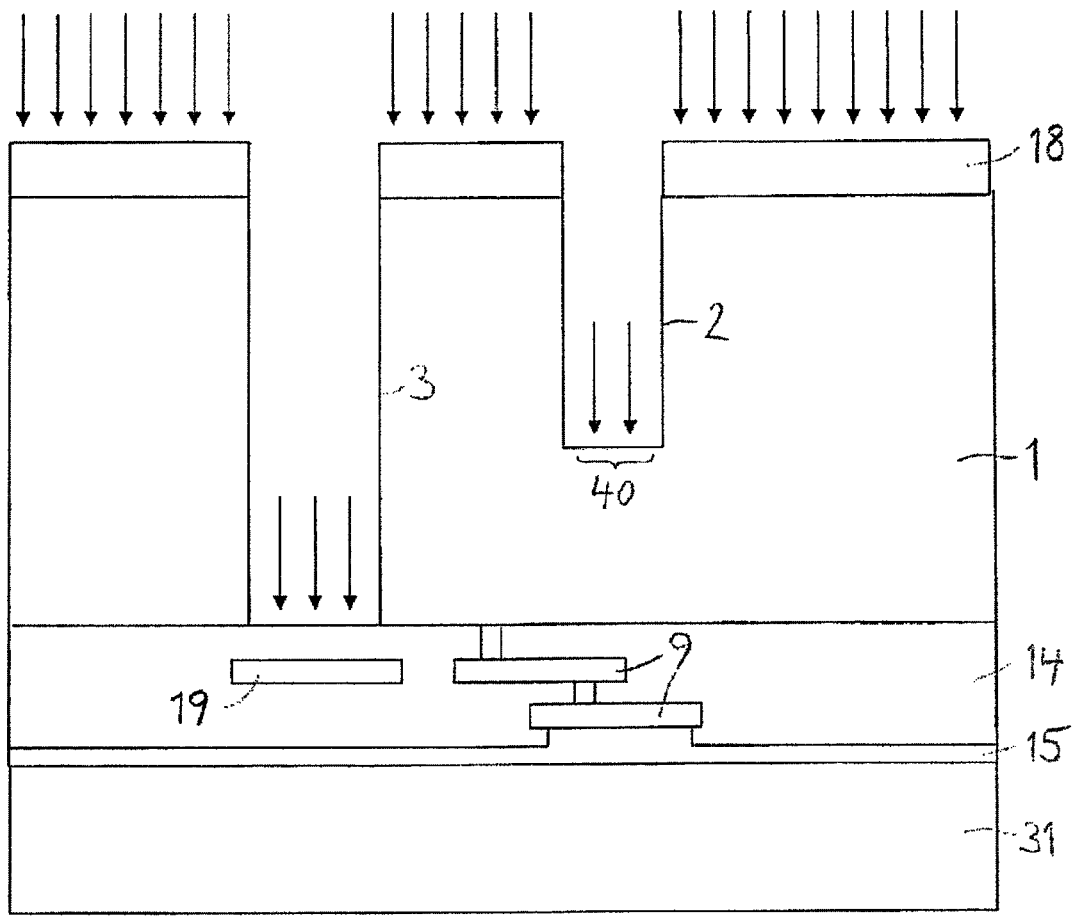
FIG. 7 shows a cross-section according to FIG. 6 after an etching step.

FIG. 7 shows a cross-section according to FIG. 6 after the etching of the contact hole 2 and the via hole 3. The arrows indicate an optional implantation of a dopant, which increases the electrical conductivity of the semiconductor material at the bottom area 40 of the contact hole 2 in order to improve the substrate contact 4. The implant is preferably annealed at an elevated temperature in the way that is known per se from the formation of doped regions in semiconductor material.

Figure 8:
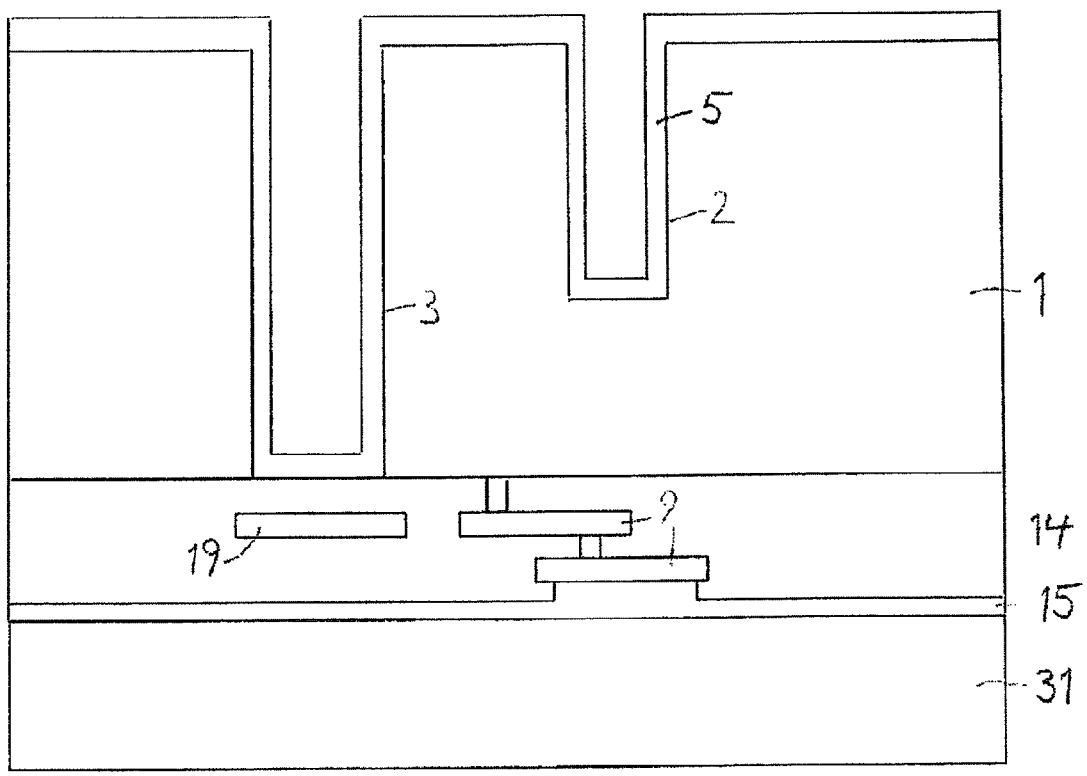
FIG. 8 shows a cross-section according to FIG. 7 after an application of a dielectric layer.

FIG. 8 shows a cross-section according to FIG. 7 after the removal of the mask 18 and an application of a dielectric layer 5, which may be an oxide of the semiconductor material, silicon dioxide for instance. The dielectric layer 5 is provided to insulate the via metallization 13 from the semiconductor material at the wall of the via hole 3 and optionally also to insulate the contact metallization 12 from the semiconductor material at the wall of the contact hole 2.

The dielectric layer 5 is removed at least from the bottom of the contact hole 2 and from the bottom of the via hole 3. This may be achieved by a standard anisotropic spacer etching. The dielectric layer 5 may completely be removed from the contact hole 2. Instead, the contact hole 2 may be covered by a mask while the dielectric layer 5 is formed in the via hole 3, so that the mask prevents the formation of a dielectric layer in the contact hole 2. In an embodiment according to FIG. 8 it may be necessary to remove a portion of the dielectric layer 14 from the contact area of the terminal 19 before the via metallization 13 is applied.

Figure 9:
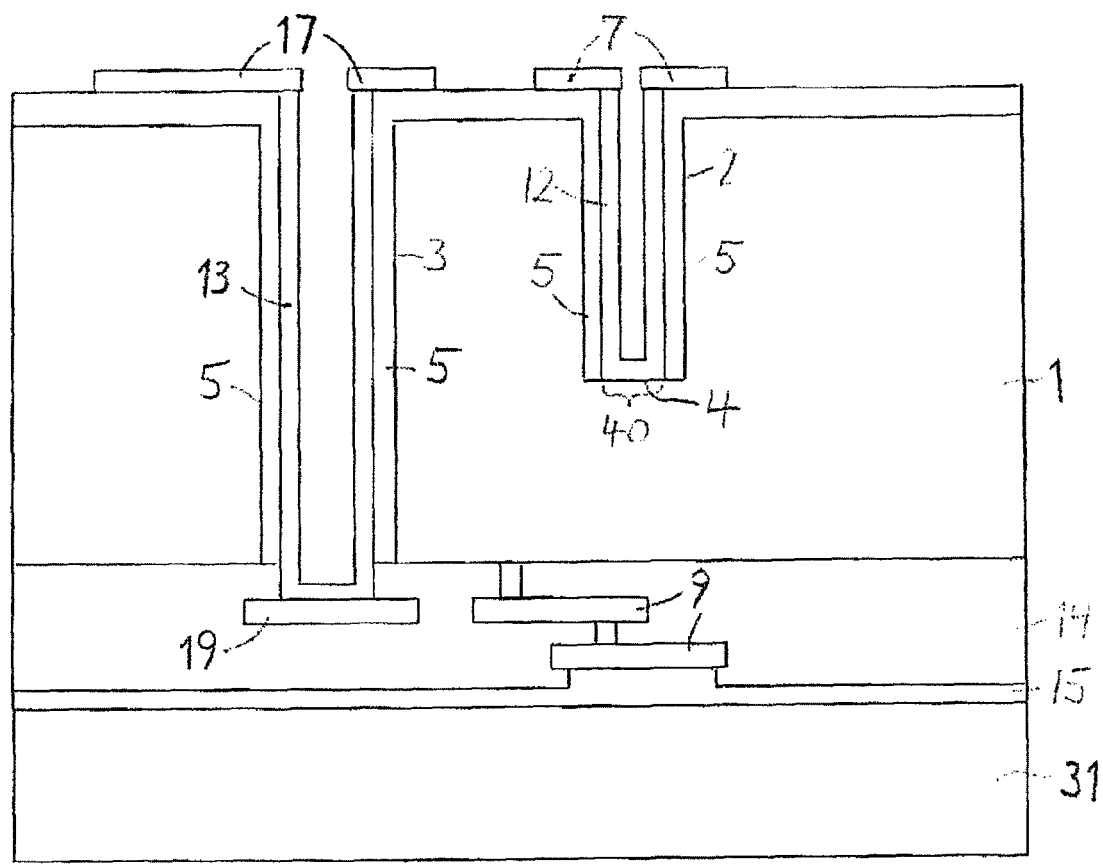
FIG. 9 shows a cross-section according to FIG. 8 after an application of metallizations.

FIG. 9 shows a cross-section according to FIG. 8 after an application of a contact metallization 12 in the contact hole 2 and a via metallization 13 in the via hole 3. The contact metallization 12 makes a contact on the semiconductor material within the substrate 1 at least in the bottom area 40 of the contact hole 2, where the electrical conductivity may optionally have been increased by the implantation mentioned above.

A surface metal 7 may be applied as a separate layer and structured in sections that are in contact with the contact metallization 12 and the via metallization 13, respectively. Instead, the surface metal 7 may be structured out of an upper superficial portion of an initially entire metal layer that is deposited for the formation of both the contact metallization 12 and the via metallization 13. The surface metal 7 may particularly provide a pad 17.

Figure 10:
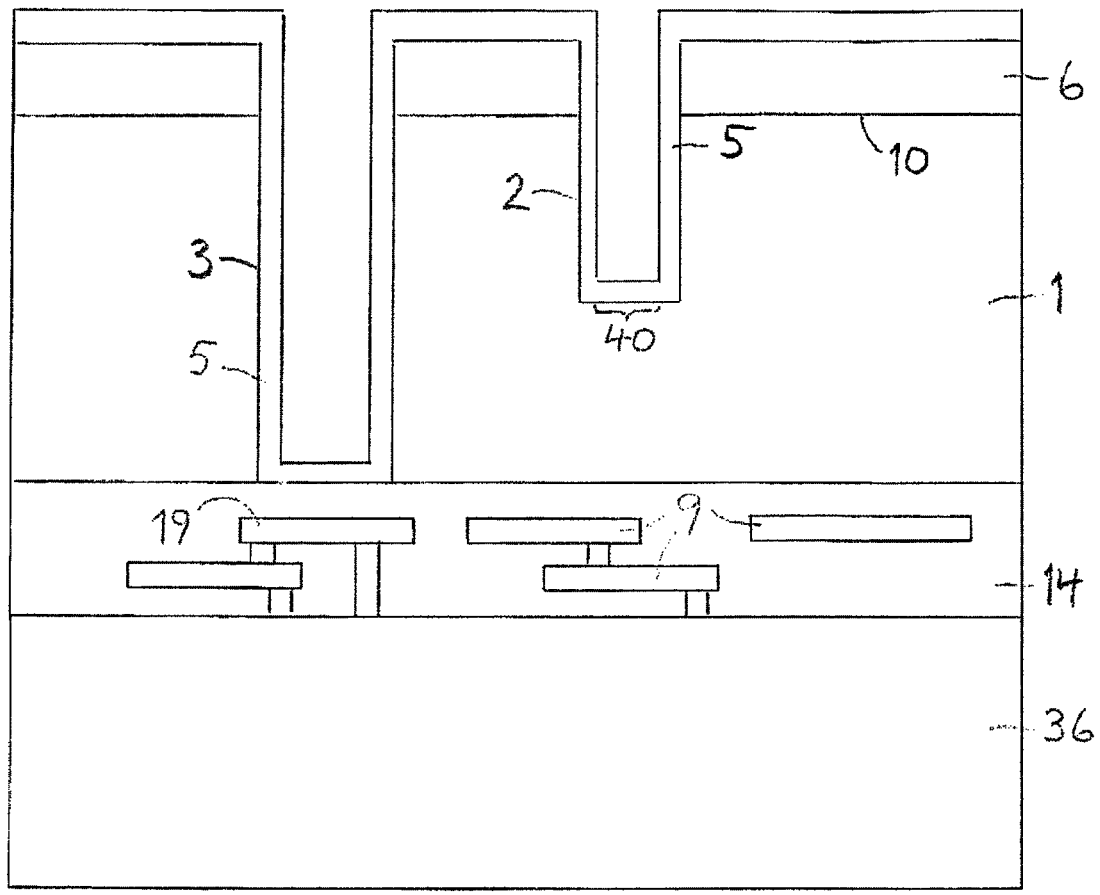
FIG. 10 shows a cross-section according to FIG. 8 for a further embodiment.

FIG. 10 shows a cross-section according to FIG. 8 for a further embodiment, in which the substrate 1 is a top wafer in combination with a bottom wafer 36 of semiconductor material. A dielectric layer 14 is arranged between the substrate 1 and the bottom wafer 36 and may comprise a wiring 9. The dielectric layer 14 may be formed on the top wafer, on the bottom wafer or partially on both wafers, before the wafers are bonded. At the substrate surface 10 facing away from the bottom wafer 36, an electronic circuit, especially a CMOS circuit, may have been integrated, preferably before the contact hole 2 and the via hole 3 are etched. A dielectric layer 6 may be provided on the surface 10 as an intermetal dielectric for a wiring of the circuit, which is not shown in detail.

FIG. 10 shows the intermediate product after the deposition of the dielectric layer 5, which is subsequently removed from above the contact area of the terminal 19 and from the bottom area 40 of the contact hole 2. Then a contact metallization 12 and a via metallization 13 are applied according to the embodiment of FIG. 9.

Figure 11:
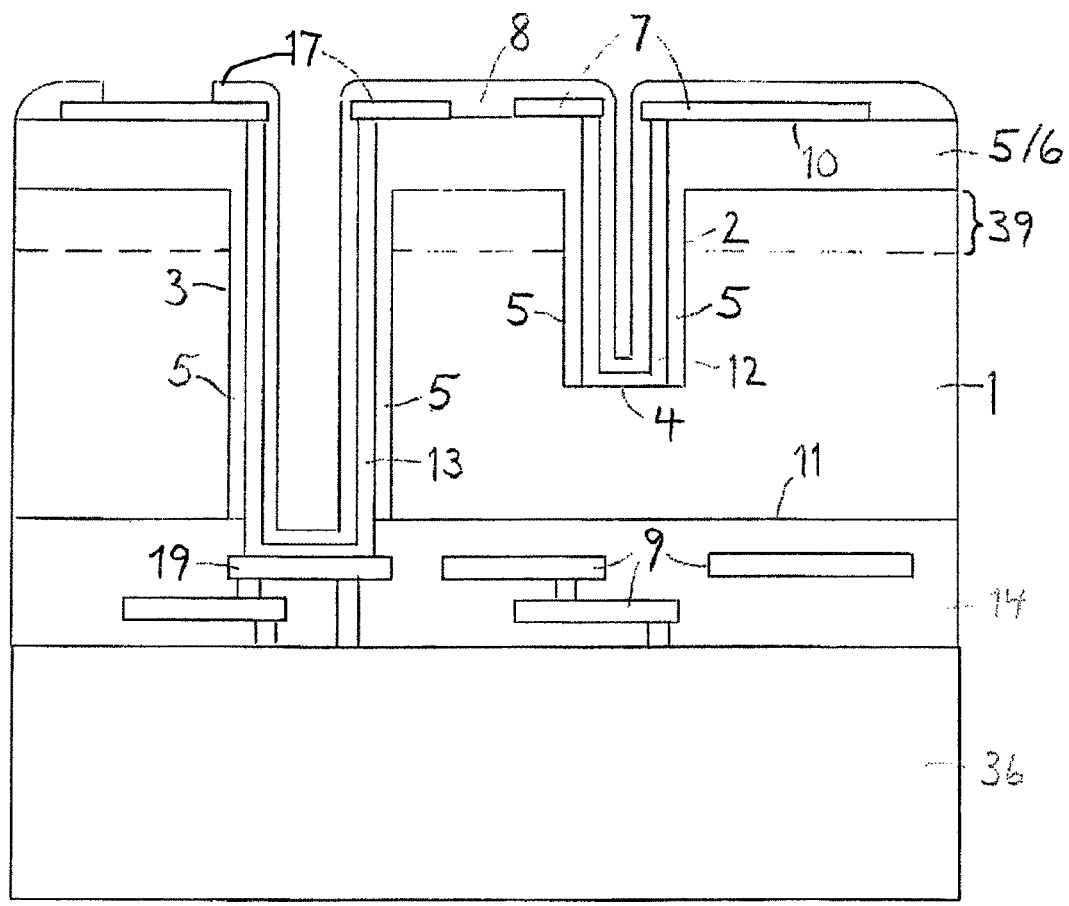
FIG. 11 shows a cross-section according to FIG. 1 for a further embodiment.

FIG. 11 shows a cross-section according to FIG. 1 for an embodiment which may be produced via the intermediate product shown in FIG. 10. The elements of this embodiment that are similar to elements of the embodiment according to FIG. 1 are designated with the same reference numerals. The bottom wafer 36 of the embodiment according to FIG. 11 is not removed like a handling wafer. The substrate 1 comprises the internal substrate contact 4 and a through-substrate via. The dielectric layer 14 may comprise a wiring 9 as shown in FIG. 11, which is provided as a rear wiring of the components of the circuit that are integrated at the upper surface 10.

The substrate 1 may comprise a doped semiconductor material with a high doping concentration, which renders a low-ohmic contact of the contact metallization 12 on the semiconductor material and a favorably high electrical conductivity. Such a high doping concentration may not be appropriate for electronic components of the integrated circuit, which may especially be a CMOS circuit. In this case the main portion of the substrate 1, which encompasses the region in which the internal substrate contact 4 is located, may nevertheless be highly doped if an epitaxial layer 39 that is undoped or moderately doped is epitaxially grown on the substrate 1 and the circuit components are integrated in the epitaxial layer 39.

The internal substrate contact described above can easily be produced in conjunction with through-substrate vias and therefore provides an advantageous structure for an electrical protection around the through-substrate vias. Cross-talk and electrostatic damage can thus be prevented, particularly in applications comprising high signal frequencies. Further favorable applications include optical sensors or the like.

LIST OF REFERENCE NUMERALS 1 substrate
2 contact hole
3 via hole 4 substrate contact
5 dielectric layer
6 dielectric layer
7 surface metal
8 passivation
9 wiring
10 substrate surface
11 substrate edge
12 contact metallization
13 via metallization
14 dielectric layer
15 planarizing layer
16 conductor track
17 pad
18 mask
19 terminal
20 row of contact holes
21 contact trench
22 depth of the contact hole
23 depth of the via hole
24 distance
25 distance
26 distance
27 distance
28 distance
29 distance
30 distance
31 handling wafer
32 width or diameter of the contact hole
32' width of the contact trench
33 width or diameter of the via hole
34 distance
35 distance
36 bottom wafer
37 small opening
38 large opening
39 epitaxial layer
40 bottom area

The invention claimed is:

1. A semiconductor device comprising:
a substrate (1) of semiconductor material with a surface (10);
a contact hole (2) reaching from the substrate surface (10) into the substrate (1);
a contact metalization (12) in the contact hole (2);
characterized in that
the contact metalization (12) makes a substrate contact (4) on the semiconductor material, and
the substrate contact (4) occupies at least a bottom area (40) of the contact hole (2);
a plurality of further contact holes (2) reaching from the substrate surface (10) into the substrate (1), with contact metalizations (12) in the contact holes (2) making substrate contacts (4) on the semiconductor material,
the contact holes (2) being arranged in at least one row (20) of contact holes (2),
wherein the contact hole (2) is in the shape of a contact trench (21) of longitudinal extension; and
a through-substrate via (3, 13), the contact trench (21) being arranged along a line passing by the through-substrate via (3, 13).

2. The semiconductor device according to claim 1, further comprising:
a via hole (3) penetrating the substrate (1) from the substrate surface (10); and
a via metalization (13) in the via hole (3),
the contact hole (2) and the via hole (3) having different widths or diameters (32, 33).

3. A semiconductor device comprising:
a substrate (1) of semiconductor material with a surface (10);
a contact hole (2) reaching from the substrate surface (10) into the substrate (1);
a contact metalization (12) in the contact hole (2);
characterized in that
the contact metalization (12) makes a substrate contact (4) on the semiconductor material, and
the substrate contact (4) occupies at least a bottom area (40) of the contact hole (2);
a plurality of further contact holes (2) reaching from the substrate surface (10) into the substrate (1), with contact metalizations (12) in the contact holes (2) making substrate contacts (4) on the semiconductor material,
the contact holes (2) being arranged in at least one row (20) of contact holes (2),
wherein the contact hole (2) is in the shape of a contact trench (21) of longitudinal extension;
a via hole (3) penetrating the substrate (1) from the substrate surface (10); and
a via metalization (13) in the via hole (3),
the contact hole (2) and the via hole (3) having different widths or diameters (32, 33).

4. The semiconductor device according to claim 1, 2 or 3, wherein the substrate contact (4) is limited by a dielectric layer (5) arranged between the contact metalization (12) and the semiconductor material of the substrate (1).

5. The semiconductor device according to claim 1, 2, or 3, further comprising:
a through-substrate via (3, 13), the row (20) of contact holes (2) being arranged along a line passing by the through-substrate via (3, 13).

6. A method of producing a semiconductor device, comprising:
providing a substrate (1) of semiconductor material;
etching a contact hole (2) into the substrate (1);
disposing a contact metalization (12) in the contact hole (2);
characterized in that
the contact metalization (12) is applied making a substrate contact (4) on the semiconductor material at least in a bottom area (40) of the contact hole (2);
using a mask (18) having at least a small opening (37) and a large opening (38);
etching the contact hole (2) through the large opening (38) and a via hole (3) penetrating the substrate (1) through the small opening (37); and
disposing a via metalization (13) in the via hole (3).

7. The method according to claim 6, further comprising:
performing an implantation of a dopant through the contact hole (2) into the semiconductor material of the substrate (1) before the disposition of the contact metalization (12).

8. The method according to claim 6, further comprising:
providing the substrate (1) with a high doping and with an epitaxial layer (39) of undoped or moderately doped semiconductor material; and
making the substrate contact (4) on the highly doped semiconductor material.

9. A method of producing a semiconductor device comprising:
providing a substrate (1) of semiconductor material;
etching a contact hole (2) into the substrate (1);

disposing a contact metalization (12) in the contact hole (2), characterized in that the contact metalization (12) is applied making a substrate contact (4) on the semiconductor material at least in a bottom area (40) of the contact hole (2);

using a mask (18) having at least a small opening (37) and a large opening (38);

etching the contact hole (2) through the small opening (37) and a via hole (3) penetrating the substrate (1) through the large opening (38);

disposing a via metalization (13) in the via hole (3); and performing an implantation of a dopant through the contact hole (2) into the semiconductor material of the substrate (1) before the disposition of the contact metalization (12).

10. A method of producing a semiconductor device comprising:

providing a substrate (1) of semiconductor material;

etching a contact hole (2) into the substrate (1);

disposing a contact metalization (12) in the contact hole (2), characterized in that the contact metalization (12) is applied making a substrate contact (4) on the semiconductor material at least in a bottom area (40) of the contact hole (2);

using a mask (18) having at least a small opening (37) and a large opening (38);

etching the contact hole (2) through the small opening (37) and a via hole (3) penetrating the substrate (1) through the large opening (38);

disposing a via metalization (13) in the via hole (3);

providing the substrate (1) with a high doping and with an epitaxial layer (39) of undoped or moderately doped semiconductor material; and making the substrate contact (4) on the highly doped semiconductor material.

\* \* \* \* \*